United States Patent
Lin et al.

[11] Patent Number: 5,930,625
[45] Date of Patent: Jul. 27, 1999

[54] METHOD FOR FABRICATING A STACKED, OR CROWN SHAPED, CAPACITOR STRUCTURE

[75] Inventors: Dahcheng Lin, Hsinchu; Jung-Ho Chang, Uen-Lin; Hsi-Chuan Chen, Tainan, all of Taiwan

[73] Assignee: Vanguard International Semiconductor Corporation, Hsin-Chu, Taiwan

[21] Appl. No.: 09/066,016

[22] Filed: Apr. 24, 1998

[51] Int. Cl.$^6$ .............................................. H01L 21/8242
[52] U.S. Cl. .......................................... 438/253; 438/398
[58] Field of Search .................................. 438/398, 255, 438/253, 396, 964

[56] References Cited

U.S. PATENT DOCUMENTS

| | | | |
|---|---|---|---|
| 5,340,763 | 8/1994 | Dennison | 437/52 |
| 5,346,844 | 9/1994 | Cho et al. | 438/396 |
| 5,385,863 | 1/1995 | Tatsumi et al. | 438/665 |
| 5,407,534 | 4/1995 | Thakur | 156/662 |
| 5,444,653 | 8/1995 | Nagasawa et al. | 365/149 |
| 5,634,974 | 6/1997 | Weimer et al. | 117/103 |
| 5,639,685 | 6/1997 | Zahurak et al. | 437/60 |
| 5,656,531 | 8/1997 | Thakur et al. | 438/398 |
| 5,663,090 | 9/1997 | Dennison et al. | 438/398 |
| 5,691,228 | 11/1997 | Ping et al. | 438/398 |
| 5,753,559 | 5/1998 | Yew et al. | 438/398 |
| 5,821,152 | 10/1998 | Han et al. | 438/396 |
| 5,854,095 | 12/1998 | Kang et al. | 438/398 |
| 5,858,837 | 1/1999 | Sakoh et al. | 438/398 |
| 5,858,852 | 1/1999 | Aiso et al. | 438/398 |

*Primary Examiner*—Tuan H. Nguyen
*Attorney, Agent, or Firm*—George O. Saile; Stephen B. Ackerman

[57] ABSTRACT

A method for creating a stacked, or crown shaped, capacitor structure, with increased surface area, obtained using a storage node electrode, comprised of HSG silicon grains on the surface of the storage node electrode, has been developed. An in situ procedure, allows HSG silicon seeds to be selectively formed, only on the exposed surfaces of a amorphous silicon storage node electrode shape, in an LPCVD system, directly after an HF preclean step. A subsequent anneal, again performed in situ, in the LPCVD system, results in the formation of HSG silicon grains, converted from the HSG silicon seeds.

19 Claims, 3 Drawing Sheets

METHOD FOR FABRICATING A STACKED, OR CROWN SHAPED, CAPACITOR STRUCTURE

RELATED PATENT APPLICATION

"HEMISPHERICAL GRAIN POLYSILICON WITH IMPROVED ADHESION AND REDUCED CAPACITANCE DEPLETION " by D. Lin, J. H. CHANG, H. C. CHEN, of Vanguard International Semiconductor Corporation, invention disclosure, Ser. No. 09/047,543, filed Mar. 25, 1998, assigned to a common assignee.

BACKGROUND OF THE INVENTION (1) Field of the Invention

The present invention relates to a method used to increase the surface area of a capacitor structure, used for a dynamic random access memory, (DRAM) devices.

(2) Description of the Prior Art

Improved device performance and the reduced manufacturing costs of these devices, are major objectives of the semiconductor industry. These objectives have been successfully addressed by the ability of the semiconductor industry to fabricate semiconductor memory chips with sub-micron features, or microminiaturization. Sub-micron features allow the reduction in performance degrading capacitances and resistances to be realized. In addition the smaller features result in a smaller chip, however still possessing the same level of integration obtained for semiconductor chips fabricated with larger features. This allows a greater number of the denser, smaller chips to be obtained from a specific size starting substrate, thus resulting in a lower manufacturing cost for an individual chip.

The use of smaller, or sub-micron, features, when used for the fabrication of dynamic random access memory, (DRAM), devices, in which the capacitor of the DRAM device is a stacked capacitor, (STC), or crown, structure, presents difficulties when attempting to increase STC capacitance. A DRAM cell is usually comprised of the STC structure, overlying a transfer gate transistor, and connected to the source of the transfer gate transistor. However the decreasing size of the transfer gate transistor, limits the dimensions of the STC structure. To increase the capacitance of the STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the STC structure is limited by the area of the underlying transfer gate transistor dimensions. The advancement of the DRAM technology to densities of 64 million cells per chip, or greater, has resulted in a specific cell in which a smaller transfer gate transistor is being used, resulting in less of an overlying area for placement of overlying STC structures.

One method of maintaining, or increasing STC capacitance, while still decreasing the lateral dimension of the capacitor, has been the use of rough, or hemispherical grain, (HSG), silicon layers. HSG silicon layers have been used as an overlying layer, on a conventional polysilicon structure, as shown by Dennison, in U.S. Pat. No. 5,340,763, and by Nagasawa, et al, in U.S. Pat. No. 5,444,653. The convex and concave features of the HSG silicon layer result in increases in capacitor surface area, without consuming additional device area, thus resulting in DRAM capacitance increases, when compared to counterparts fabricated with smooth capacitor surfaces. However several factors have limited the use of HSG layers, for DRAM applications. The presence of an unwanted thin native oxide, on an underlying polysilicon capacitor surface, can result in poor adhesion between the subsequent HSG silicon layer, and the underlying polysilicon capacitor. The unwanted native oxide can also interfere with the selective deposition of HSG silicon, when deposition is only desired on underlying polysilicon surfaces, not on neighboring insulator surfaces. To alleviate the effect of the thin native oxide a high vacuum, in situ cleaning procedure, has to be used prior to HSG silicon deposition. The need for high vacuum, native oxide removal, requires a specific tool, different from the system used for HSG seeding and formation, thus increasing process cost and complexity.

This invention will describe a process for creating HSG silicon, in a conventional low pressure chemical vapor deposition, (LPCVD), system, featuring an hydrofluoric, (HF), vapor pre-clean, performed in a low pressure chamber, of a cluster tool, transfer of the semiconductor wafers, in nitrogen environment, to an LPCVD chamber, in the cluster tool, followed by a selective HSG seeding procedure, and by a selective HSG and formation procedure, both performed in the same LPCVD system at a pressure less than 1 Torr, thus avoiding the need for more costly equipment, that would be necessary if a pressure in the range of $10^{-8}$ torr were to be used.

SUMMARY OF THE INVENTION

It is an object of this invention to increase the surface area of a stacked capacitor, or crown structure, for a DRAM device, via the use of a storage node electrode, featuring a top surface comprised of HSG silicon.

It is another object of this invention to perform an an HSG silicon seeding procedure, and an HSG silicon grain formation procedure, in situ, in the same LPCVD chamber, of a cluster tool, after a HF vapor pre-clean procedure, performed in a low pressure chamber, in the same cluster tool.

It is still another object of this invention to selectively seed, and selectively form HSG silicon, in an LPCVD chamber, at a pressure below 1.0 torr, without using ultra high vacuum, (UHV), tools or procedures.

In accordance with the present invention a method for forming HSG silicon grains, on the top surface of a storage node electrode shape, using a preclean procedure, a HSG silicon seeding procedure, and an HSG silicon grain formation procedure, all performed in situ, in a LPCVD furnace, has been developed. A transfer gate transistor comprised of: a thin gate insulator; an insulator capped, polysilicon gate structure, formed from a first polysilicon layer; a lightly doped source and drain region; insulator spacers on the sides of the polysilicon gate structure; and a heavily doped source and drain region; is formed on a semiconductor substrate. An insulator layer, is next deposited, planarized, and followed by the opening of a storage node contact hole in the insulator layer, made to expose the source region of the transfer gate transistor. An amorphous silicon layer is deposited, and doped, via use of in situ doping procedures. After patterning of the amorphous silicon layer, forming the storage node electrode shape, HF vapors are used to remove native oxide from the surface of the storage node electrode shape, in a low pressure chamber of a cluster tool. After transfer of the semiconductor wafers to a LPCVD chamber, in the same cluster tool, the temperature is increased, the pressure is reduced, and a silane gas is introduced, selectively growing HSG silicon seeds on the exposed surface of the storage node electrode shape. The procedure is then continued in situ, without the use of silane gas, to selectively form HSG silicon grains, from the HSG silicon seeds, resulting in a storage node electrode, featuring a top surface comprised of HSG silicon grains. The creation of a capacitor dielectric layer, on the top surface of storage node electrode, followed by the formation of a capacitor plate electrode, completed the process sequence used for fabrication of an STC, or crown structure, for a DRAM device, using a storage node electrode featuring a top surface comprised with HSG silicon grains.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming a storage node structure, for a DRAM device, featuring HSG silicon grains, on the top surface of a storage node electrode, used to increase the surface area, and the capacitance of the STC structure, will now be described in detail. The transfer gate transistor, used for this DRAM device, in this invention, will be an N channel device. However the STC structure, with the increased surface area described in this invention, can also be applied to P channel, transfer gate transistor.

Figure 1:
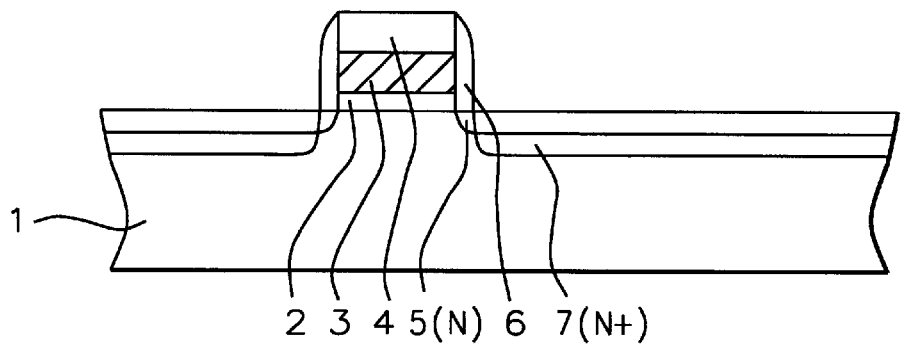
FIGS. 1–6, which schematically, in cross-sectional style, show the key fabrication stages used to create a a STC, or crown structure for a DRAM device, in which the top portion of a storage node electrode is overlaid with HSG silicon grains.

Referring to FIG. 1, a P type, semiconductor substrate 1, with a <100>, single crystalline orientation, is used. After a series of wet cleans, a gate insulator layer 2, of silicon oxide is thermally grown in an oxygen-steam ambient, at a temperature between about 750 to 1050° C., to a thickness between about 50 to 200 Angstroms. A polysilicon layer 3, is next deposited using low pressure chemical vapor deposition, (LPCVD), procedures, at a temperature between about 500 to 700° C., to a thickness between about 500 to 4000 Angstroms. The polysilicon can either be grown intrinsically and doped via ion implantation of arsenic or phosphorous, at an energy between about 10 to 80 KeV, at a dose between about 1E13 to 1E16 atoms/cm$^2$, or grown using in situ doping procedures, via the incorporation of either arsine or phosphine to the silane ambient. A polycide layer, comprised of either titanium silicide, or tungsten silicide, on polysilicon, can be used in place of polysilicon layer 3, if desired. A first insulator layer 4, comprised of silicon oxide, used as a cap insulator layer, is next grown via the use of either LPCVD or plasma enhanced chemical vapor deposition, (PECVD), procedures, to a thickness between about 600 to 2000 Angstroms. First insulator layer 4, can also be a silicon nitride layer, again deposited using LPCVD or PECVD procedures, to a thickness between about 600 to 2000 Angstroms. Conventional photolithographic and reactive ion etching, (RIE), procedures, using CHF$_3$ as an etchant for first insulator layer 4, and using Cl$_2$ as an etchant for polysilicon layer 3, are used to create the polysilicon gate structure, comprised of polysilicon layer 3, with overlying capping, first insulator layer 4, shown schematically in FIG. 1. Photoresist removal is accomplished via plasma oxygen ashing and careful wet cleans.

A lightly doped source and drain region 5, is next formed via ion implantation of phosphorous, at an energy between about 5 to 60 KeV, at a dose between about 1E13 to 1E15 atoms/cm$^2$. A second insulator layer, comprised of silicon oxide, is then deposited using either LPCVD or PECVD procedures, at a temperature between about 400 to 850° C., to a thickness between about 1500 to 4000 Angstroms, followed by an anisotropic RIE procedure, using CHF$_3$ as an etchant, creating insulator spacers 6, on the sides of the polysilicon, or polycide, gate structure. Insulator spacers 6, can also be comprised of silicon nitride. A heavily doped source and drain region 7, is then formed via ion implantation of arsenic, at an energy between about 30 to 100 KeV, at a dose between about 1E14 to 5E16 atoms/cm$^2$. The result of these steps are also shown schematically in FIG. 1.

Figure 2:
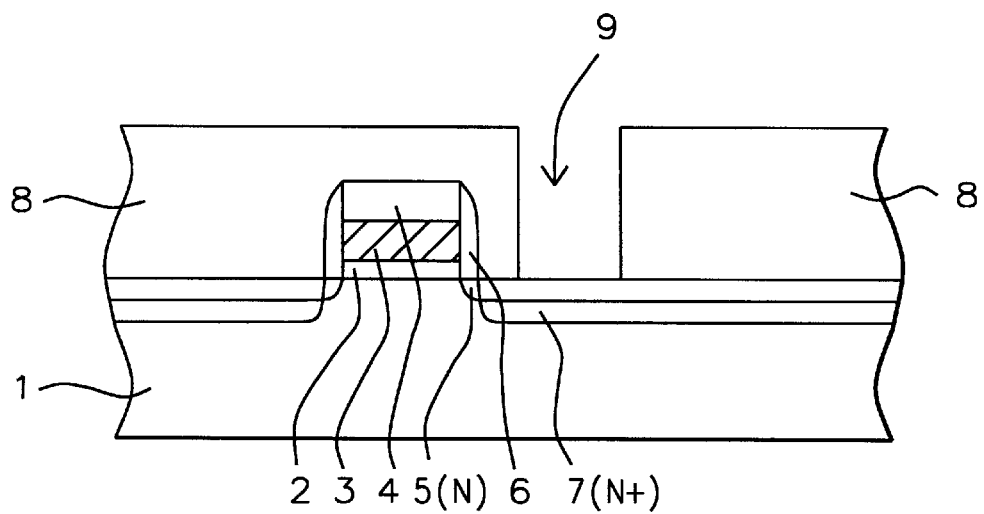

A third insulator layer 8, comprised of either silicon oxide, boro-phosphosilicate glass, (BPSG), or phosphosilicate glass, (PSG), is next deposited, using LPCVD or PECVD procedures, at a temperature between about 600 to 800° C., to a thickness between about 2000 to 10000 Angstroms. Third insulator layer 8, is grown using tetraethylorthosilicate, (TEOS) as a source with the addition of either diborane and phosphine, for the BPSG layer, or the addition of only phosphine, for the PSG layer. Third insulator layer 8, is then planarized using chemical mechanical polishing, to provide a smoother surface for subsequent depositions and patterning procedures. Conventional photolithographic and RIE procedures, using CHF$_3$ as an etchant, are used to open storage node contact hole 9, in third insulator layer 9, exposing the top surface of heavily doped source and drain region 7. Photoresist removal is performed via use of plasma oxygen ashing and careful wet cleans. The result of these procedures are schematically shown in FIG. 2.

Figure 3:
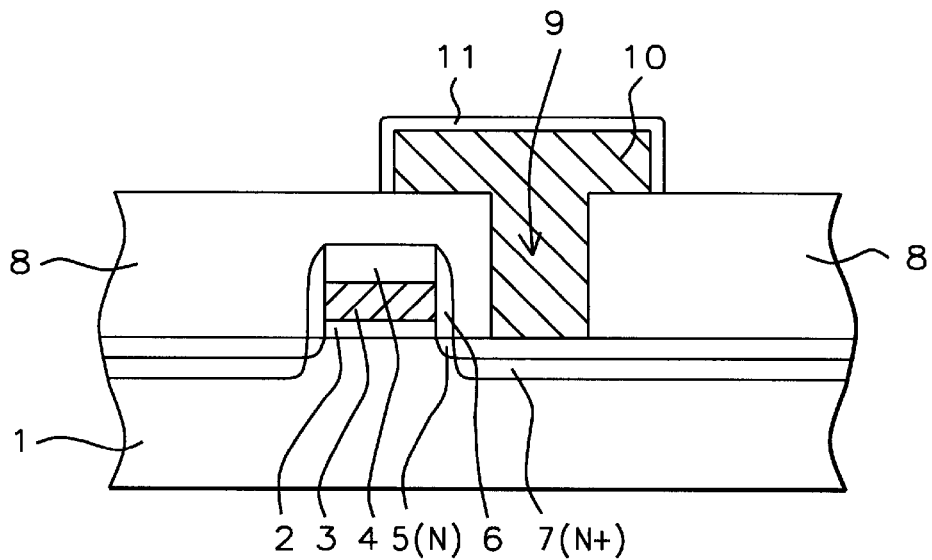

Referring to FIG. 3, an amorphous silicon layer is deposited, via LPCVD procedures, at a temperature below 550° C., to a thickness between about 200 to 10000 Angstroms, completely filling storage node contact hole 9. The amorphous silicon layer is deposited using an in situ doping procedure, via the addition of phosphine, to a silane, or a disilane ambient, resulting in an amorphous silicon layer with an N type dopant concentration between about 0 to 4E20 atoms/cm$^3$. Photolithographic and RIE procedures, using Cl$_2$ as an etchant, are used to pattern the amorphous silicon layer, creating amorphous silicon shape 10, which will be used as a subsequent storage node electrode. This is schematically shown in FIG. 3. Removal of the masking photoresist shape, used to define amorphous silicon, storage node electrode 10, via plasma oxygen ashing and careful wet cleans, results in the formation of a thin native oxide 11, between about 10 to 50 Angstroms in thickness, on the exposed surfaces of storage node electrode 10. This is also schematically shown in FIG. 3. The storage node electrode shape can also be comprised of polysilicon. In addition the storage node structure can be patterned to be crown shaped, comprised of vertical silicon features, connected to, and extending from, a horizontal silicon feature. The crown configuration would result in an increase in surface area for the storage node structure, compared to counterparts fabricated without the vertical silicon extensions.

Figure 4:
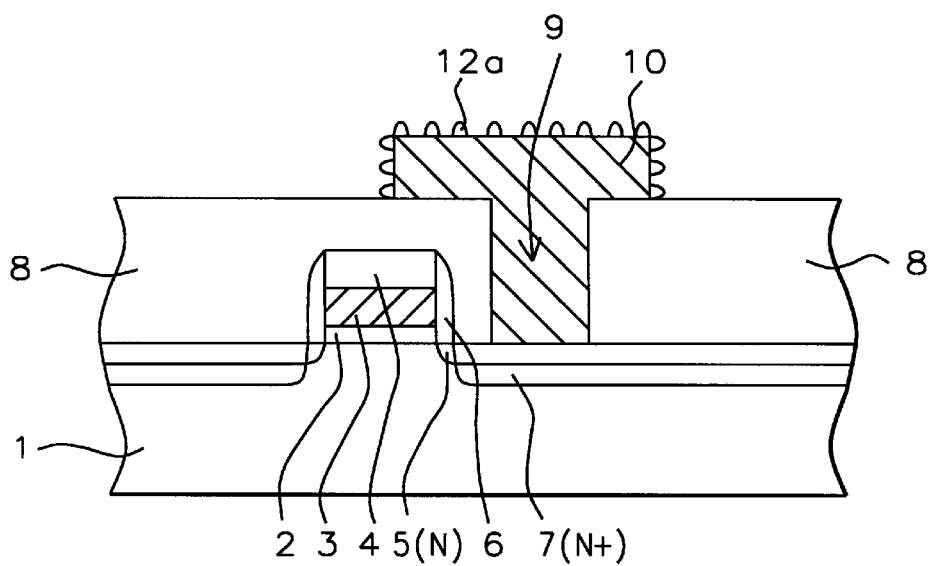
Figure 5:
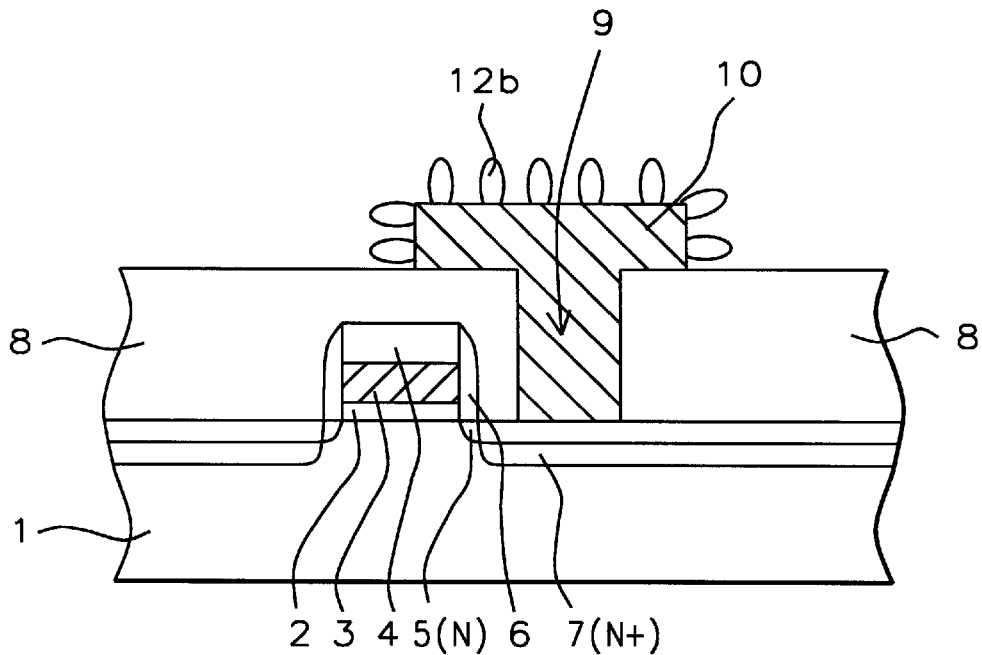

A method to remove native oxide layer 11, in a low pressure chamber of a cluster tool, and then to form HSG silicon seeds 12a, and to convert HSG silicon seeds 12a, to HSG silicon grains 12b, in an LPCVD chamber, in the cluster tool, will now be described, and shown schematically in FIGS. 4–5. A hydrofluoric, (HF), vapor etch, is performed in a low pressure chamber of a cluster tool, via injection of HF vapors, at a pressure between about 10 to 760 Torr, and at a temperature between about 20 to 25° C., removing native oxide layer 11, from the surface of amorphous silicon, storage node electrode 11. The semiconductor substrate is next transferred, in the cluster tool, in a nitrogen environment, without exposure to the outside environment, to a LPCVD chamber, in the same cluster tool, for formation of HSG silicon seeds 12a, selectively formed, only on the amorphous silicon surface, of storage node electrode 11. This is accomplished at a temperature between about 550 to 580° C., at a pressure less than 1.0 torr, for a time between about 10 to 120 min. The HSG silicon seeds are selectively formed on the surface of amorphous silicon using a $SiH_4$, or a $Si_2H_6$ at a low concentration, below 1.0E–3 moles/m³. The above conditions, referring to the oxide free surface of amorphous silicon, the temperature, and reactant flows, allow HSG silicon seeding only on the amorphous silicon surface, not on the surface of exposed third insulator layer 8. This is schematically shown in FIG. 4. Next, the $SiH_4$, or $Si_2H_6$ flow is stopped, and at the same temperature, previously used for HSG silicon seeding, between about 550 to 580° C., and at the same pressure, previously used for HSG silicon seeding, less than 1.0 torr, an annealing procedure, in a nitrogen ambient is in situ performed in the LPCVD chamber, for a time between about 0 to 120 min, resulting in the formation of HSG silicon grains 12b, with a diameter between about 200 to 800 Angstroms. This is schematically shown in FIG. 5. The height and grain size of HSG silicon grains 12b, located on the amorphous silicon surface, result in an increase in surface area of storage node electrode 10, now comprised of HSG silicon grains 12b, on the amorphous silicon layer.

Figure 6:
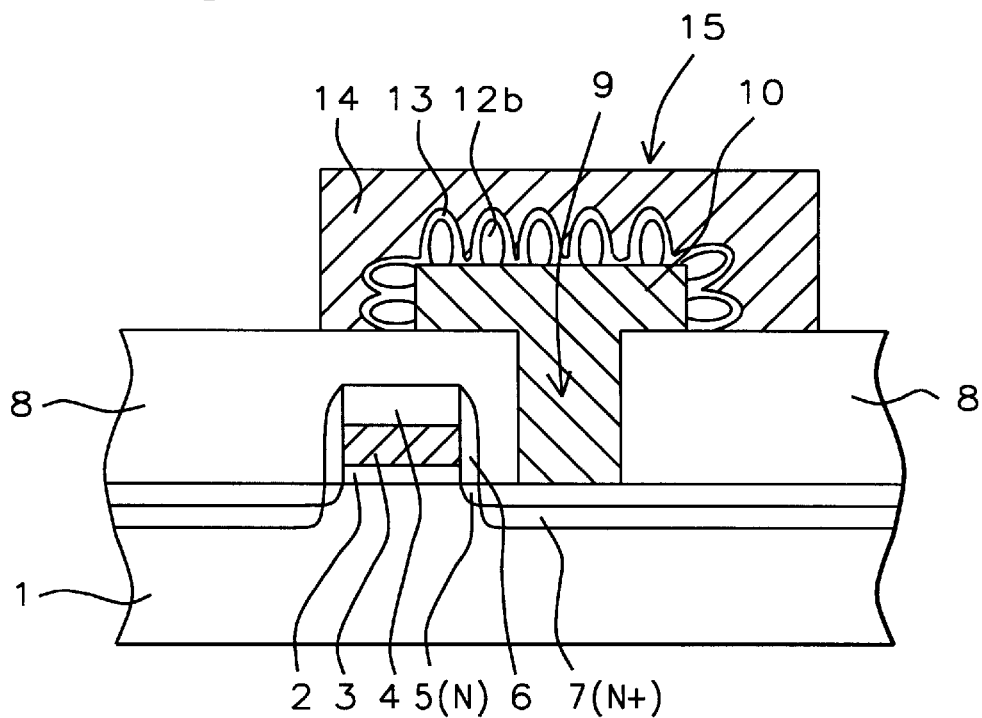

A capacitor dielectric layer 13, exhibiting a high dielectric constant, such as $Ta_2O_5$, is next formed on the storage node electrode surface, roughened via the inclusion of HSG silicon grains 12b. The $Ta_2O_5$ layer is obtained via r.f sputtering, or chemical vapor deposition techniques, at an equivalent silicon dioxide thickness between about 20 to 80 Angstroms. Capacitor dielectric layer 13, can also be ONO, (Oxidized-silicon Nitride-silicon Oxide), or capacitor dielectric layer can be NO, (nitride-oxide). The ONO, or NO layer is formed by initially growing a silicon dioxide layer, on storage node electrode 11, between about 10 to 50 Angstroms, followed by the deposition of a silicon nitride layer, between about 10 to 100 Angstroms. Subsequent thermal oxidation of the silicon nitride layer results in the formation of a silicon oxynitride layer on silicon oxide, at a silicon oxide equivalent thickness of between about 30 to 80 Angstroms. Finally a polysilicon layer is deposited, via LPCVD procedures, at a temperature between about 500 to 700° C., to a thickness between about 500 to 2000 Angstroms. Doping of polysilicon layer is accomplished via an situ doping deposition procedure, by the addition of phosphine, to the silane ambient. Photolithographic and RIE procedures, using $Cl_2$ as an etchant, are next employed to pattern polysilicon layer, creating the upper electrode, or plate electrode 14, of the DRAM, STC structure 15, schematically shown in FIG. 6. Photoresist is again removed via plasma oxygen ashing and careful wet cleans.

While this invention has been particularly shown and described with reference to the preferred embodiments thereof, it will be understood by those skilled in the art that various changes in form and details may be made without departing from the spirit and scope of this invention.

What is claimed is:

1. A method for fabricating a stacked, or crown shaped, capacitor structure, for a DRAM device, on a semiconductor substrate, comprising the steps of:

providing a transfer gate transistor, on said semiconductor substrate, comprised of a polysilicon gate structure, on a gate insulator layer, with a source and drain region in regions of said semiconductor substrate, not covered by said polysilicon gate structures;

forming a storage node contact hole, in an insulator layer, exposing the top surface of a source region;

forming a storage node electrode shape, from an in situ doped, amorphous silicon layer, on the top surface of said insulator layer, and completely filling said storage node contact hole;

performing a preclean procedure in a low pressure chamber, located in a cluster tool, to remove native oxide from the surface of said storage node electrode shape;

selectively forming hemispherical grain, (HSG), silicon seeds, on the surface of said storage node electrode shape, in situ, in a LPCVD chamber, of said cluster tool, using a silane, or disilane flow, below 1.0E–3 moles/m3;

growing HSG silicon grains, with a diameter between about 200 to 800 Angstroms, from said HSG silicon seeds, via an anneal procedure, performed in situ, in said LPCVD chamber, of said cluster tool, creating a storage node electrode, comprised of said HSG silicon grains on said storage node electrode shape;

forming a capacitor dielectric layer on said storage node electrode;

depositing a polysilicon layer; and patterning of said polysilicon layer to form the upper electrode for said stacked, or crown shaped capacitor structure.

2. The method of claim 1, wherein said storage node electrode shape is comprised of amorphous silicon, obtained via deposition of an amorphous layer, using an LPCVD procedure, at a temperature below 550° C., to a thickness between about 200 to 10000 Angstroms, and doped in situ via the addition of phosphine, to a silane, or disilane ambient, resulting in said amorphous silicon layer with a surface concentration between about 0 to 4E20 atoms/cm³.

3. The method of claim 1, wherein said storage node electrode shape is formed via an anisotropic RIE procedure, applied to said amorphous silicon layer, using $Cl_2$ as an etchant.

4. The method of claim 1, wherein said preclean procedure, used to remove native oxide from the surface of said storage node electrode shape, is performed in said low pressure chamber, using hydrofluoric vapors, at a temperature between about 20 to 25° C., and at a pressure between about 10 to 760 Torr.

5. The method of claim 1, wherein said HSG silicon seeds are formed on the surface of said storage node electrode shape, in said furnace, at a temperature between about 550 to 580° C., at a pressure below 1.0 torr, using a silane, or a disilane flow at a concentration below 1.0E–3 moles/m³.

6. The method of claim 1, wherein said HSG silicon grains, are created by annealing of said HSG seeds, in said furnace, at a temperature between about 550 to 580° C., at a pressure less than 1.0 torr, in nitrogen ambient, for a time between about 0 to 120 min.

7. The method of claim 1, wherein said capacitor dielectric layer is $Ta_2O_5$, obtained using R.F. sputtering, or chemical vapor deposition procedures, to an equivalent silicon oxide thickness between about 20 to 80 Angstroms.

8. The method of claim 1, wherein said capacitor dielectric layer is ONO or NO, at an equivalent silicon dioxide thickness between about 20 to 80 Angstroms, created by an initial thermal oxidation of said thin, heavily doped, polysilicon layer, to form a silicon dioxide layer, between about 0 to 50 Angstroms, followed by a deposition of silicon nitride, to a thickness between about 10 to 100 Angstroms, and thermal oxidation of said silicon nitride layer, creating a silicon oxynitride layer, on the underlying, said silicon dioxide layer.

9. The method of claim 1, wherein said upper electrode, of said stacked, or crown shaped capacitor structure, is formed via deposition of a polysilicon layer, using LPCVD procedures, at a thickness between about 500 to 10000 Angstroms, and patterning of said polysilicon layer, via an anisotropic RIE procedure, using $Cl_2$ as a etchant.

10. A method of fabricating a storage node electrode, for a DRAM, stacked, or crown shaped capacitor structure, using in situ furnace procedures, to perform a HF vapor pre-clean procedure, to selectively form HSG silicon seeds, in situ, and to anneal, to form HSG silicon grains, in situ, on the surface of a storage node electrode shape, comprising the steps of:

providing a transfer gate transistor on a semiconductor substrate, comprised of a polysilicon gate structure, on an underlying gate insulator layer, and with source and drain region in said semiconductor substrate;

depositing an insulator layer on said transfer gate transistor;

planarizing said insulator layer;

opening a storage node contact hole in said insulator layer, exposing the top surface a source region, in said transfer gate transistor;

depositing an in situ doped, amorphous silicon layer on top surface of said insulator layer, and completely filling said storage node contact hole;

patterning of said in situ doped, amorphous silicon layer to form an amorphous silicon storage node electrode shape;

performing an HF preclean procedure, in a low pressure chamber, in a cluster tool, to remove native oxide from the surface of said amorphous silicon storage node electrode;

selectively forming HSG silicon seeds, on the surface of said storage node electrode shape, via a procedure, performed in situ, in a LPCVD chamber, located in said cluster tool, using a silane, or disilane flow, below 1.0 E–3 moles/m$_3$;

growing HSG silicon grains, with a diameter between about 200 to 800 Angstroms, from said HSG silicon seeds, via an anneal procedure, performed in situ, in said LPCVD chamber, creating a storage node electrode, comprised of said HSG silicon grains on said amorphous silicon storage node electrode shape;

forming a capacitor dielectric layer on said storage node electrode;

depositing a polysilicon layer; and patterning of said polysilicon layer to form upper electrode structure, for said DRAM, stacked capacitor structure.

11. The method of claim 10, wherein said in situ doped, amorphous silicon layer is obtained via LPCVD procedures, at a temperature below 550° C., to a thickness between about 200 to 10000 Angstroms, with said in situ doped, amorphous silicon having an N type concentration between about 0 to 4E20 atoms/cm$^3$, resulting from an in situ doping procedure, using phosphine in a silane, or in a disilane ambient.

12. The method of claim 10, wherein said in situ doped, amorphous silicon storage node electrode shape is formed via anisotropic RIE procedures, applied to said in situ doped, amorphous silicon layer, using $Cl_2$ as an etchant.

13. The method of claim 10, wherein said HF preclean procedure, is performed in said low pressure chamber, of said cluster tool, at a temperature between about 20 to 25° C., at a pressure between about 10 to 760 torr.

14. The method of claim 10, wherein said HSG silicon seeds are selectively formed, in said LPCVD chamber, of said cluster tool, on the surface of said in situ doped, amorphous silicon storage node electrode shape, at a temperature between about 550 to 580° C., at a pressure less than 1.0 torr, using a silane, or a disilane flow with a concentration below 1.0E–3 mole/m$^3$.

15. The method of claim 10, wherein said HSG silicon grains are formed, in situ in said LPCVD chamber, via annealing of said HSG silicon seeds, at a temperature between about 550 to 580° C., at a pressure below 1.0 torr, in a nitrogen ambient for a time between about 0 to 120 min.

16. The method of claim 10, wherein said capacitor dielectric layer is ONO, or NO, with an equivalent silicon dioxide thickness between about 20 to 80 Angstroms, created by growing a thin silicon oxide layer on said thin, heavily doped, polysilicon layer, at a thickness between about 0 to 50 Angstroms, depositing between about 10 to 100 Angstroms of a silicon nitride layer, and oxidizing said silicon nitride layer to from a silicon oxynitride layer on said thin silicon oxide layer.

17. The method of claim 10, wherein said capacitor dielectric layer is $Ta_2O_5$, deposited using R.F. sputtering, to an equivalent silicon dioxide thickness between about 20 to 80 Angstroms.

18. The method of claim 10, wherein said polysilicon layer is deposited using LPCVD procedures, at a temperature between about 500 to 700° C., to a thickness between about 500 to 2000 Angstroms.

19. The method of claim 10, wherein said upper polysilicon electrode structure is created via RIE of said polysilicon layer, using $Cl_2$ as an etchant.

* * * * *